United States Patent
Zhou

(10) Patent No.: US 10,416,234 B2
(45) Date of Patent: Sep. 17, 2019

(54) DIAGNOSIS SYSTEM FOR VEHICULAR DC CHARGING RELAY

(71) Applicant: NIO CO., LTD., Shanghai (CN)

(72) Inventor: Yi Zhou, Shanghai (CN)

(73) Assignee: NIO CO., LTD, Shanghai (CN)

( * ) Notice: Subject to any disclaimer, the term of this patent is extended or adjusted under 35 U.S.C. 154(b) by 5 days.

(21) Appl. No.: 15/895,681

(22) Filed: Feb. 13, 2018

(65) Prior Publication Data

US 2018/0231610 A1 Aug. 16, 2018

(30) Foreign Application Priority Data

Feb. 13, 2017 (CN) .......................... 2017 1 0075641

(51) Int. Cl.
| | |
|---|---|
| *G01R 31/327* | (2006.01) |
| *B60L 3/00* | (2019.01) |
| *B60L 50/50* | (2019.01) |
| *B60L 53/30* | (2019.01) |
| *B60L 58/10* | (2019.01) |
| *G01R 31/00* | (2006.01) |

(52) U.S. Cl.
CPC ........ *G01R 31/3275* (2013.01); *B60L 3/0023* (2013.01); *B60L 50/50* (2019.02); *B60L 53/30* (2019.02); *B60L 58/10* (2019.02); *G01R 31/3274* (2013.01); *G01R 31/3278* (2013.01); *G01R 31/006* (2013.01); *Y02T 10/7005* (2013.01)

(58) Field of Classification Search
CPC .................................................. G01R 31/3278
USPC ................................................... 320/104, 109
See application file for complete search history.

(56) References Cited

U.S. PATENT DOCUMENTS

| | | | |
|---|---|---|---|
| 9,772,392 B2 * | 9/2017 | Deumal Herraiz | G01R 35/00 |
| 2015/0346257 A1 * | 12/2015 | Tabatowski-Bush | G01R 31/006 324/503 |

\* cited by examiner

*Primary Examiner* — Edward Tso
*Assistant Examiner* — Ahmed H Omar
(74) *Attorney, Agent, or Firm* — Sheridan Ross P.C.

(57) ABSTRACT

The present invention provides a diagnosis system for vehicular DC charging relay, the system comprises a controller, two resistor clusters R1 and R2, and a switch S, wherein, two resistor clusters R1 and R2 are bridging in a serially connected way in between the DC charging high voltage cables of the vehicle, the resistor cluster R1 consists of two serially connected sub-resistors, and the controller is able to measure a voltage V1 at a common terminal of the two serially connected sub-resistors via a first voltage detection port, the resistor cluster R2 consists of two serially connected sub-resistors, and the controller is able to measure a voltage V2 at a common terminal of the two serially connected sub-resistors via a second voltage detection port, the controller is able to execute a diagnosis operation, and the diagnosis operation is based on the measurements of the voltages V1 and V2.

20 Claims, 1 Drawing Sheet

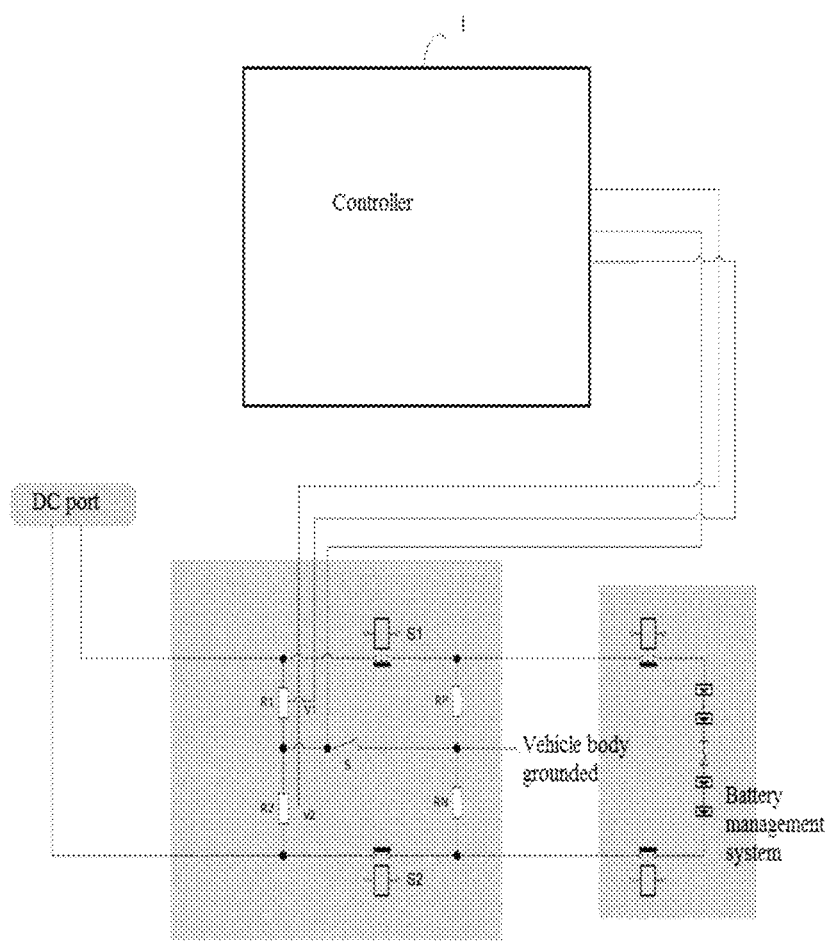

DIAGNOSIS SYSTEM FOR VEHICULAR DC CHARGING RELAY

CROSS-REFERENCE TO RELATED APPLICATIONS

This application claims the benefit of China Patent Application No. 201710075641.7 filed Feb. 13, 2017, the entire contents of which are incorporated herein by reference.

FIELD OF INVENTION

The present invention relates to diagnosis systems, and more particularly, to a diagnosis system for vehicular DC charging relay.

BACKGROUND

At present, with the increasing development and popularization of electric control systems (e.g. an electric control system in a pure electric/hybrid vehicle), charging a power battery pack of a vehicle (e.g. a pure electric/hybrid vehicle) using DC current via a charging station or a charging pile is becoming more and more important.

In a prior technical solution, typically two high voltage relays (e.g. high voltage relay S1 and S2 in FIG. 1) are added into a high voltage bus loop which is used for DC charging, thus, in the case of non-DC charging, the two high voltage relays is disconnected by a controller, to ensure that the high voltage electricity will not be exposed to the outside and result in accidents.

However, the above prior technical solution has the following problems: due to the physical/mechanical features of the relay, the contacts of the two high voltage relays are likely to adhere (i.e., loose efficacy since keep staying in a closed state for a long time) in the course of operation, in this case, the high voltage electricity on an internal high voltage circuit may be exposed to the outside, thereby potential accidents may be caused.

Hence, there is a need for the following: providing a diagnosis system for vehicular DC charging relay with high diagnostic efficiency and low cost.

SUMMARY OF INVENTION

In order to solve the above problems existed in the prior technical solutions, the present invention provides a diagnosis system for vehicular DC charging relay with high diagnostic efficiency and lower cost.

The object of the invention is implemented by the following technical solutions:

A diagnosis system for vehicular DC charging relay, which comprises a controller, two resistor clusters R1 and R2, and a switch S, wherein, the two resistor clusters R1 and R2 are bridging in a serially connected way in between DC charging high voltage cables of the vehicle, a first terminal of the resistor cluster R1 is electrically connected to one side of a DC charging high voltage cable of the vehicle and a first terminal of the resistor cluster R2 is electrically connected to the other side of the DC charging high voltage cable of the vehicle, a second terminal of the resistor cluster R1, a second terminal of the resistor cluster R2, and a first terminal of the switch S are electrically connected, and a second terminal of the switch S is in connection with a ground of the vehicle body, and wherein, the resistor cluster R1 consists of two serially connected sub-resistors, and a common terminal of the two serially connected sub-resistors which constitute the resistor cluster R1 is electrically connected to a first voltage detection port of the controller 1 so that the controller 1 may measure a voltage V1 at the common terminal of two serially connected sub-resistors which constitute the resistor cluster R1 via the first voltage detection port, and the resistor cluster R2 consists of two serially connected sub-resistor, and a common terminal of the two serially connected sub-resistors which constitute the resistor cluster R2 is electrically connected to a second voltage detection port of the controller 1 so that the controller 1 may measure a voltage V2 at the common terminal of two serially connected sub-resistors which constitute the resistor cluster R2 via the second voltage detection port, a first terminal of the switch S is electrically connected to a third voltage detection port of the controller 1 to assist the controller 1 in detecting the voltages V1 and V2, wherein, the controller 1 executes a diagnosis operation by controlling On/Off states of a DC charging relay S1 and a DC charging relay S2 which are located on different sides of the DC charging high voltage cable of the vehicle as well as the switch S, and the diagnosis operation is based on measurements of voltages V1 and V2.

In the solution disclosed above, preferably, the first terminal of the resistor cluster R1 is electrically connected to the DC charging high voltage cable between the DC charging relay S1 and a DC charging port of the vehicle, and the first terminal of the resistor cluster R2 is electrically connected to the DC charging high voltage cable between the DC charging relay S2 and the DC charging port of the vehicle.

In the technical solution disclosed above, preferably, the diagnosis operation may only be executed after the DC charging port of the vehicle is disconnected with an external charger.

In the solution disclosed above, preferably, the diagnosis operation comprises: (B1) closing the switch S; (B2) measuring an initial value of voltage V1 and an initial value of voltage V2; (B3) disconnecting the DC charging relay S1; (B4) measuring current values of voltages V1 and V2, and comparing the current values of voltages V1 and V2 to the initial values of voltages V1 and V2, if the values of voltages V1 and V2 remain unchanged, then it is determined that an adhering malfunction has occurred at DC charging relay S1.

In the solution disclosed above, preferably, the diagnosis operation further comprises: after determining that an adhering malfunction has occurred at DC charging relay S1, proceeding to execute the following operations: (C1) disconnecting the DC charging relay S2; (C2) measuring the current values of voltages V1 and V2, and comparing the current values of voltages V1 and V2 to the initial values of voltage V1 and V2, if the values of voltages V1 and V2 remain unchanged, then it is determined that an adhering malfunction has occurred at DC charging relay S2, and the diagnosis operation is terminated subsequently.

In the solution disclosed above, preferably, the diagnosis operation further comprises: if it is determined in step (C2) that the value of voltage V2 has dropped to zero, and the value of voltage V1 has dropped to a first predetermined value, then it is determined that no adhering malfunction has occurred at DC charging relay S2, and the diagnosis operation is terminated subsequently.

In the solution disclosed above, preferably, the diagnosis operation further comprises: if it is determined in step (B4) that the voltage V1 has dropped to zero, and the voltage V2 has dropped to a second predetermined value, then it is determined that no adhering malfunction has occurred at DC charging relay S1.

In the solution disclosed above, preferably, the diagnosis operation further comprises: after determining that no adhering malfunction has occurred at DC charging relay S1, proceeding to execute the following operations: (D1) disconnecting the DC charging relay S2; (D2) measuring the current values of voltages V1 and V2, and comparing the current values of voltages V1 and V2 to zero and the second predetermined value respectively, if the values of voltages V1 and V2 remain unchanged, then it is determined that an adhering malfunction has occurred at DC charging relay S2, and the diagnosis operation is terminated subsequently.

In the solution disclosed above, preferably, the diagnosis operation further comprises: if it is determined in step (D2) that the current values of voltage V1 and voltage V2 have dropped to zero, then it is determined that no adhering malfunction has occurred at DC charging relay S2, and the diagnosis operation is terminated subsequently.

In the solution disclosed above, the diagnosis operation may be accomplished in the following way: accomplishing the diagnosis operation by way of detecting the current values of V1 and V2 and subsequently inquiring a preset state mapping table according to the detected current values of V1 and V2, wherein, the state mapping table comprising a mapping relationship between values of V1 and V2 and current states thereof.

The present invention also discloses a vehicular DC charging system, wherein, any of the diagnosis systems for vehicular DC charging relay described and illustrated above is its subsystem.

The diagnosis system for vehicular DC charging relay disclosed in the present invention has the following advantages: the operating state of a DC charging relay is enabled to be diagnosed accurately and promptly, and since the diagnosis operation is enabled to be executed right after the vehicular DC charging port is disconnected with the external charger, therefore the diagnosis is prompt and the cost is relatively low.

BRIEF DESCRIPTION OF DRAWINGS

In conjunction with the drawings, the technical characteristics and advantages of the invention may be better understood by those skilled in the art, wherein:

FIG. 1 is a schematic structure diagram of the diagnosis system for vehicular DC charging relay according to the invention.

DESCRIPTION OF EMBODIMENTS

FIG. 1 is a schematic structure diagram of the diagnosis system for vehicular DC charging relay according to the invention. As showed in FIG. 1, the diagnosis system for vehicular DC charging relay disclosed in the invention comprises: a controller 1, two resistor clusters R1 and R2, and a switch S, wherein, the two resistor clusters R1 and R2 are bridging in a serially connected way in between DC charging high voltage cables of the vehicle, a first terminal of the resistor cluster R1 is electrically connected to one side of the DC charging high voltage cable of the vehicle and a first terminal of the resistor cluster R2 is electrically connected to the other side of the DC charging high voltage cable of the vehicle, a second terminal of the resistor cluster R1, a second terminal of the resistor cluster R2, and a first terminal of the switch S are electrically connected, and a second terminal of the switch S is in connection with a ground of the vehicle body, and wherein, the resistor cluster R1 consists of two serially connected sub-resistors, and a common terminal of the two serially connected sub-resistors which constitute the resistor cluster R1 is electrically connected to a first voltage detection port of the controller 1 so that the controller 1 may measure a voltage V1 at the common terminal of two serially connected sub-resistors which constitute the resistor cluster R1 via the first voltage detection port, and the resistor cluster R2 consists of two serially connected sub-resistor, and a common terminal of the two serially connected sub-resistors which constitute the resistor cluster R2 is electrically connected to a second voltage detection port of the controller 1 so that the controller 1 may measure a voltage V2 at the common terminal of two serially connected sub-resistors which constitute the resistor cluster R2 via the second voltage detection port, a first terminal of the switch S is electrically connected to a third voltage detection port of the controller 1 to assist the controller 1 in detecting the voltages V1 and V2, wherein, the controller 1 executes a diagnosis operation by controlling On/Off state of a DC charging relay S1 and a DC charging relay S2 which are located on different sides of the DC charging high voltage cable of the vehicle as well as the switch S, and the diagnosis operation is based on measurements of voltages V1 and V2.

Preferably, in the diagnosis system for vehicular DC charging relay disclosed in the present patent application, the first terminal of the resistor cluster R1 is electrically connected with the DC charging high voltage cable between the DC charging relay S1 and the DC charging port of the vehicle (i.e., a port provided for an external charger), and the first terminal of the resistor cluster R2 is electrically connected with the DC charging high voltage cable between the DC charging relay S2 and the DC charging port of the vehicle.

Preferably, in the diagnosis system for vehicular DC charging relay disclosed in the present patent application, the diagnosis operation may only be executed after the DC charging port of the vehicle is disconnected with an external charger.

Preferably, in the diagnosis system for vehicular DC charging relay disclosed in the present patent application, the diagnosis operation comprises: (B1) closing the switch S; (B2) measuring an initial value of voltage V1 and an initial value of voltage V2; (B3) disconnecting the DC charging relay S1; (B4) measuring current values of voltages V1 and V2, and comparing the current values of voltages V1 and V2 to the initial values of voltages V1 and V2, if the values of voltages V1 and V2 remain unchanged, then it is determined that an adhering malfunction has occurred at DC charging relay S1.

Preferably, in the diagnosis system for vehicular DC charging relay disclosed in the present patent application, the diagnosis operation further comprises: after determining that an adhering malfunction has occurred at DC charging relay S1, proceeding to execute the following operations: (C1) disconnecting the DC charging relay S2; (C2) measuring the current values of voltages V1 and V2, and comparing the current values of voltages V1 and V2 to the initial values of voltages V1 and V2, if the values of voltages V1 and V2 remain unchanged, then it is determined that an adhering malfunction has occurred at DC charging relay S2, and the diagnosis operation is terminated subsequently.

Preferably, in the diagnosis system for vehicular DC charging relay disclosed in the present patent application, the diagnosis operation further comprises: if it is determined in step (C2) that the value of voltage V2 has dropped to zero, and the value of voltage V1 has dropped to a first predetermined value, then it is determined that no adhering malfunction has occurred at DC charging relay S2, and the diagnosis operation is terminated subsequently.

Preferably, in the diagnosis system for vehicular DC charging relay disclosed in the present patent application, the diagnosis operation further comprises: if it is determined in step (B4) that the voltage V1 has dropped to zero, and the voltage V2 has dropped to a second predetermined value, then it is determined that no adhering malfunction has occurred at DC charging relay S1.

Preferably, in the diagnosis system for vehicular DC charging relay disclosed in the present patent application, the diagnosis operation further comprises: after determining that no adhering malfunction has occurred at DC charging relay S1, proceeding to execute the following operations: (D1) disconnecting the DC charging relay S2; (D2) measuring the current values of voltages V1 and V2, and comparing the current values of voltages V1 and V2 to zero and the second predetermined value respectively, if the values of voltages V1 and V2 remain unchanged, then it is determined that an adhering malfunction has occurred at DC charging relay S2, and the diagnosis operation is terminated subsequently.

Preferably, in the diagnosis system for vehicular DC charging relay disclosed in the present patent application, the diagnosis operation further comprises: if it is determined in step (D2) that the current values of voltage V1 and voltage V2 have dropped to zero, then it is determined that no adhering malfunction has occurred at DC charging relay S2, and the diagnosis operation is terminated subsequently.

Preferably, in the diagnosis system for vehicular DC charging relay disclosed in the present patent application, the initial value of voltage V1 typically equals to the value determined by the following formula:

$$V1 = \frac{\frac{R1 \times RP}{R1 + RP}}{\frac{R1 \times RP}{R1 + RP} + \frac{R2 \times RN}{R2 + RN}} \times VBATT$$

Wherein, RP and RN are insulation resistances of the vehicle (as showed in FIG. 1), VBATT is the current voltage value of the vehicular power battery pack.

Preferably, in the diagnosis system for vehicular DC charging relay disclosed in the present patent application, the initial value of voltage V2 typically equals to the value determined by the following formula:

$$V2 = \frac{\frac{R2 \times RN}{R2 + RN}}{\frac{R1 \times RP}{R1 + RP} + \frac{R2 \times RN}{R2 + RN}} \times VBATT$$

Wherein, RP and RN are insulation resistances of the vehicle (as showed in FIG. 1), VBATT is the current voltage value of the vehicular power battery pack.

Preferably, in the diagnosis system for vehicular DC charging relay disclosed in the present patent application, the first predetermined value is determined by the following formula:

$$V1 = \frac{\frac{R1 \times RP}{R1 + RP}}{\frac{R1 \times RP}{R1 + RP} + RN} \times VBATT$$

Wherein, RP is an insulation resistance of the vehicle (as showed in FIG. 1), VBATT is the current voltage value of the vehicular power battery pack.

Preferably, in the diagnosis system for vehicular DC charging relay disclosed in the present patent application, the second predetermined value is determined by the following formula:

$$V2 = \frac{\frac{R2 \times RN}{R2 + RN}}{\frac{R1 \times RP}{R1 + RP} + RP} \times VBATT$$

Wherein, RN is an insulation resistance of the vehicle (as showed in FIG. 1), VBATT is the current voltage value of the vehicular power battery pack.

Preferably, in the diagnosis system for vehicular DC charging relay disclosed in the present patent application, the diagnosis operation may be accomplished in the following way: accomplishing the diagnosis operation by way of detecting the current values of V1 and V2 and subsequently inquiring a preset state mapping table according to the detected current values of V1 and V2, wherein, the state mapping table comprises a mapping relationship between values of V1 and V2 and current states of V1 and V2.

Exemplarily, in the diagnosis system for vehicular DC charging relay disclosed in the present patent application, the voltages V1 and V2 are detected via a specific circuit in the high voltage distribution box in the vehicle, and the controller 1 is part of the vehicle control unit, or the controller 1 is part of any other controllers in the vehicle.

Optionally, in the diagnosis system for vehicular DC charging relay disclosed in the present patent application, the controller 1 is physically independent with a dedicated controller of any controllers in the vehicle.

Preferably, in the diagnosis system for vehicular DC charging relay disclosed in the present patent application, before the diagnosis operation is executed, two main relays (i.e., system main relays) located on the high voltage cable in the vehicular power battery pack maintain a closed state.

From the above, the diagnosis system for vehicular DC charging relay disclosed in the present patent application has the following advantages: the operating state of a DC charging relay is enabled to be diagnosed accurately and promptly, and since the diagnosis operation is enabled to be executed right after the vehicular DC charging port is disconnected with the external charger, therefore the diagnosis is prompt and the cost is relatively low.

Furthermore, the present invention also discloses a vehicular DC charging system, wherein, any of the diagnosis systems for vehicular DC charging relay described and illustrated above is its subsystem.

In each of the examples described herein, the term "resistor cluster" refers to a resistor constituted by electrically connecting a plurality of sub-resistors together by way of serial connection, parallel connection, or a combination thereof. For example, the resistor cluster R1 may be a resistor that is constituted by electrically connecting a plurality of sub-resistors together by way of serial connection, parallel connection or a combination thereof.

Although the present invention is described with the preferred embodiments above, the implementation form thereof is not limited to the above embodiments. It should be realized that various changes and modifications may be made to the invention by one of ordinary skill in the art, without departing from the subject and scope of the invention.

What is claimed:

1. A diagnosis system for vehicular DC charging relay, the diagnosis system for vehicular DC charging relay comprises a controller, two resistor clusters R1 and R2, and a switch S, wherein, the two resistor clusters R1 and R2 are bridging in a serially connected way in between DC charging high voltage cables of the vehicle, a first terminal of the resistor cluster R1 is electrically connected to one side of a DC charging high voltage cable of the vehicle and a first terminal of the resistor cluster R2 is electrically connected to the other side of the DC charging high voltage cable of the vehicle, a second terminal of the resistor cluster R1, a second terminal of the resistor cluster R2, and a first terminal of the switch S are electrically connected, and a second terminal of the switch S is in connection with a ground of the vehicle body, and wherein, the resistor cluster R1 consists of two serially connected sub-resistors, and a common terminal of the two serially connected sub-resistors which constitute the resistor cluster R1 is electrically connected to a first voltage detection port of the controller so that the controller can measure a voltage V1 at the common terminal of the two serially connected sub-resistors which constitute the resistor cluster R1 via the first voltage detection port, and the resistor cluster R2 consists of two serially connected sub-resistors, and a common terminal of the two serially connected sub-resistors which constitute the resistor cluster R2 is electrically connected to a second voltage detection port of the controller so that the controller can measure a voltage V2 at the common terminal of the two serially connected sub-resistors which constitute the resistor cluster R2 via the second voltage detection port, a first terminal of the switch S is electrically connected to a third voltage detection port of the controller to assist the controller in detecting the voltages V1 and V2, wherein, the controller executes a diagnosis operation by controlling On/Off states of a DC charging relay S1 and a DC charging relay S2 which are located on different sides of the DC charging high voltage cable of the vehicle as well as the switch S, and the diagnosis operation is based on the measurements of the voltages V1 and V2.

2. According to the diagnosis system for vehicular DC charging relay of claim 1, wherein, the first terminal of the resistor cluster R1 is electrically connected to the DC charging high voltage cable between the DC charging relay S1 and a DC charging port of the vehicle, and the first terminal of the resistor cluster R2 is electrically connected to the DC charging high voltage cable between the DC charging relay S2 and the DC charging port of the vehicle.

3. According to the diagnosis system for vehicular DC charging relay of claim 2, wherein, the diagnosis operation is only executed after the DC charging port of the vehicle is disconnected with an external charger.

4. According to the diagnosis system for vehicular DC charging relay of claim 3, wherein, the diagnosis operation comprises: (B1) closing the switch S; (B2) measuring an initial value of voltage V1 and an initial value of voltage V2; (B3) disconnecting the DC charging relay S1; (B4) measuring current values of voltages V1 and V2, and comparing the current values of voltages V1 and V2 with the initial values of voltages V1 and V2, respectively, if the values of voltages V1 and V2 remain unchanged, it is determined that an adhering malfunction has occurred at DC charging relay S1.

5. According to the diagnosis system for vehicular DC charging relay of claim 4, wherein, the diagnosis operation further comprises: after determining that an adhering malfunction has occurred at DC charging relay S1, proceeding to execute the following operations: (C1) disconnecting DC charging relay S2; (C2) measuring the current values of voltages V1 and V2, and comparing the current values of voltages V1 and V2 with the initial values of voltages V1 and V2, respectively, if the values of voltages V1 and V2 remain unchanged, it is determined that an adhering malfunction has occurred at DC charging relay S2, and the diagnosis operation is terminated subsequently.

6. According to the diagnosis system for vehicular DC charging relay of claim 5, wherein, the diagnosis operation further comprises: if it is determined in step (C2) that the value of voltage V2 has dropped to zero, and the value of voltage V1 has dropped to a first predetermined value, it is determined that no adhering malfunction has occurred at DC charging relay S2, and the diagnosis operation is terminated subsequently.

7. According to the diagnosis system for vehicular DC charging relay of claim 6, wherein, the diagnosis operation further comprises: if it is determined in step (B4) that the value of voltage V1 has dropped to zero, and the value of voltage V2 has dropped to a second predetermined value, it is determined that no adhering malfunction has occurred at DC charging relay S1.

8. According to the diagnosis system for vehicular DC charging relay of claim 7, wherein, the diagnosis operation further comprises: after determining that no adhering malfunction has occurred at DC charging relay S1, proceeding to execute the following operations: (D1) disconnecting the DC charging relay S2; (D2) measuring the current values of voltages V1 and V2, and comparing the current values of voltages V1 and V2 with zero and the second predetermined value, respectively, if the values of voltages V1 and V2 remain unchanged, it is determined that an adhering malfunction has occurred at DC charging relay S2, and the diagnosis operation is terminated subsequently.

9. According to the diagnosis system for vehicular DC charging relay of claim 8, wherein, the diagnosis operation further comprises: if it is determined in step (D2) that the current values of both voltages V1 and voltage V2 have dropped to zero, it is determined that no adhering malfunction has occurred at DC charging relay S2, and the diagnosis operation is terminated subsequently.

10. According to the diagnosis system for vehicular DC charging relay of claim 1, wherein, the diagnosis operation is accomplished in the following way: accomplishing a judgment operation by way of detecting the current values of V1 and V2 and subsequently inquiring a preset state mapping table according to the detected current values of V1 and V2, wherein, the state mapping table comprises a mapping relationship between values of V1 and V2 and current states of V1 and V2.

11. A vehicular DC charging system, wherein, the vehicular DC charging system comprises the diagnosis system for vehicular DC charging relay of claim 1.

12. A vehicular DC charging system, wherein, the vehicular DC charging system comprises the diagnosis system for vehicular DC charging relay of claim 2.

13. A vehicular DC charging system, wherein, the vehicular DC charging system comprises the diagnosis system for vehicular DC charging relay of claim 3.

14. A vehicular DC charging system, wherein, the vehicular DC charging system comprises the diagnosis system for vehicular DC charging relay of claim 4.

15. A vehicular DC charging system, wherein, the vehicular DC charging system comprises the diagnosis system for vehicular DC charging relay of claim 5.

16. A vehicular DC charging system, wherein, the vehicular DC charging system comprises the diagnosis system for vehicular DC charging relay of claim 6.

17. A vehicular DC charging system, wherein, the vehicular DC charging system comprises the diagnosis system for vehicular DC charging relay of claim 7.

18. A vehicular DC charging system, wherein, the vehicular DC charging system comprises the diagnosis system for vehicular DC charging relay of claim 8.

19. A vehicular DC charging system, wherein, the vehicular DC charging system comprises the diagnosis system for vehicular DC charging relay of claim 9.

20. A vehicular DC charging system, wherein, the vehicular DC charging system comprises the diagnosis system for vehicular DC charging relay of claim 10.

\* \* \* \* \*